United States Patent
Hsieh et al.

(10) Patent No.: US 6,214,128 B1
(45) Date of Patent: Apr. 10, 2001

(54) METHOD AND APPARATUS FOR PREVENTING SILICON HOLE DEFECT FORMATION AFTER WET CLEANING

(75) Inventors: Bor-Hann Hsieh, Chung-Li; Fu-Hsing Shen, Hsin-chu; Jeng-Lian Lin, Hsing Yun Lin; Hui-Ming Chu, Hsin-chu, all of (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/283,381

(22) Filed: Mar. 31, 1999

(51) Int. Cl.⁷ .............................. C03C 23/00; B08B 6/00; B08B 3/00
(52) U.S. Cl. .................. 134/2; 134/1.3; 134/26; 134/30; 134/105; 134/108; 134/902
(58) Field of Search .............................. 134/2, 902, 105, 134/108, 26, 1.3, 30

(56) References Cited

U.S. PATENT DOCUMENTS

| | | | |
|---|---|---|---|
| 5,158,100 | * 10/1992 | Tanaka et al. | 134/105 |
| 5,220,936 | * 6/1993 | Pfahl, Jr. et al. | 134/108 |
| 5,443,540 | * 8/1995 | Kamikawa | 34/471 |
| 5,499,642 | * 3/1996 | Uchino | 134/95.1 |
| 5,776,296 | * 7/1998 | Matthews | 156/345 |
| 5,823,210 | * 10/1998 | Inada et al. | 134/105 |
| 5,894,851 | * 4/1999 | Hartman | 134/11 |

* cited by examiner

Primary Examiner—Randy Gulakowski
Assistant Examiner—Yolanda Wilkins
(74) Attorney, Agent, or Firm—Tung & Associates

(57) ABSTRACT

A method and an apparatus for preventing silicon hole defect formation on a silicon wafer after a wet cleaning process are disclosed. In the method, a supply tank and a cleaning tank are provided which are connected together in fluid communication by a conduit. The conduit is cooled by a wrapped around cooling tube and a cooling water flowing through the tube at a temperature of less than 20° C. The apparatus of the wet cleaning station may further include a pump for transporting an aqueous solution of ammonia from the supply tank to the cleaning tank, a safety overflow conduit for protecting the supply tank that holds the aqueous solution of ammonia, and a flow control valve in the conduit between the supply tank and the cleaning tank. The present invention novel method and apparatus effectively prevents the formation of ammonia vapor in the mini-environment that surrounds the cleaning tank and the rinse tank. The silicon hole defect frequently found on the surface of a wafer caused by attacks from concentrated aqueous solution of ammonia can be avoided.

20 Claims, 1 Drawing Sheet

METHOD AND APPARATUS FOR PREVENTING SILICON HOLE DEFECT FORMATION AFTER WET CLEANING

FIELD OF THE INVENTION

The present invention generally relates to a method and an apparatus for wet cleaning an electronic substrate and more particularly, relates to a method and an apparatus for preventing silicon hole defect formation after wet cleaning caused by vaporized ammonia in the environment of the wet cleaning system.

BACKGROUND OF THE INVENTION

Various techniques of etching resist-imaged photomasks, silicon wafers or other semiconductor materials have been used in semiconductor fabrication processes. A wet etching technique conducted in an immersion tank is a practical high-throughput, flexible fabrication process. By properly selecting etchant chemicals, etch reactions with the target film are thermodynamically favored over reactions with other films. Desirable etch-rate ratios can usually be obtained.

A wet etching method is especially suitable for the blanket etching of polysilicon, oxide, nitride and metal. The method is capable of providing the necessary etch selectivity, a damage-free interface and particle-contamination-free wafers. In more recently developed wet etching technology, automated robotic handling systems and ultra-pure chemicals have been used to further improve particle control and process consistency. A well-controlled wet etching technique is therefore the choice of etching process in VLSI and ULSI fabrication processes.

One of the key criteria in carrying out a wet etching process is that the etch products must be soluble in the etchant solution and therefore, no contaminating particles are generated. In an immersion etching process, the volume of the etching tank should be large enough to create enough pressure on the wafer surface in order to dislodge hydrogen gas bubbles evolved during etching reactions; to ensure an accurate balance of the etchant components; to keep the concentration of the etchant relatively constant; and to reduce the number of times the etchant tank must be changed in a production environment. An etchant bath change creates expensive down time, and furthermore, the handling of highly hazardous corrosive materials should be minimized from a safety standpoint.

Wet etching is a frequently used technique for stripping photoresist films from silicon wafers where a complete removal of the resist images without adversely affecting the wafer surface is desired. The resist layer or images should be completely removed without leaving any residues, including contaminant particles that may have been present in the resist. The underlying surface of the photoresist layer should not be adversely affected, for instance, undesirable etching of the metal or oxide surface should be avoided. Liquid etchant strippers should produce reasonable bath yield in order to prevent redeposition of dissolved resist on the wafers. The etchant should completely dissolve the photoresist layer in a chemical reaction, and not just lifting or peeling so as to prevent redeposition. It is also desirable that the etching or stripping time should be reasonably short in order to permit a high wafer throughput.

Wet chemical cleaning process is also a form of wet etching process for electronic substrates. A most commonly used wet chemical cleaning technique is based on hot alkaline or acidic hydrogen peroxide ($H_2O_2$) solutions. The mixture is commonly used to remove chemically bonded films from the surface of an electronic substrate prior to critical processing steps. A frequently used cleaning process is known as the RCA cleaning technique which is based on a two-step process of a Standard Clean-1 (or SC-1) followed by Standard Clean-2 (or SC-2). Both the SC-1 and the SC-2 cleaning solutions incorporate the strong oxidizing capability of hydrogen peroxide. Specifically, SC-1 is an aqueous alkaline solution that readily removes organic films. For instance, SC-1 etches thermally grown oxide at a rate of about 0.1 nm/min. SC-1 is typically a 1:1:5 solution mixture of ammonium hydroxide ($NH_4OH$, at 27% concentration), unstabilized $H_2O_2$ (at 30% concentration) and DI water. The SC-1 cleaning solution is very effective in removing organic contaminants since $NH_4OH$ readily dissolves organic films.

A typical wet chemical cleaning system 10 is shown in FIG. 1. The conventional system has a wet chemical cleaning tank 12 which includes an inner tank 14 and an outer tank 16. The outer tank 16 is positioned outside the inner tank 14 for providing overflow protection. This allows an overflow protection where the inner tank 14 is usually filled with a cleaning solution through inlet 18. The wet cleaning tank 12 is further positioned inside a safety containment tank 20 for preventing accidental spill of the caustic or acidic solution that are normally used in the cleaning tank 14. The safety containment tank 20 further provides containment to rinse tanks 22 and 24. The rinse tanks 22, 24 are normally filled with DI water or any other suitable rinse solution for pre-rinse and post-rinse, respectively before and after the cleaning process in tank 14. The wet cleaning tank 12 may further include a filter system and a heater system which are not shown in FIG. 1.

A major component of the SC-1 cleaning solution, i.e., an aqueous solution of ammonia, or ammonium hydroxide of 29% concentration is stored in a supply tank 30. The aqueous solution of ammonia 28 is pumped by a recirculating pump 34 into the inner tank 14 through outlet 18. The flow of the aqueous solution of ammonia 28 is controlled by a flow control valve 36 provided in the flow conduit 32. A safety overflow conduit 38 is also provided in fluid communication with the supply tank 30 to prevent the supply tank 30 from being over-pressured.

In operation, an electronic substrate such as a silicon wafer is first pre-rinsed in the rinse tank 22, then cleaned by soaking in the wet cleaning tank 14 for a predetermined period of time. The electronic substrate is then removed from tank 14 and dipped into the post-rinse tank 24 filled with DI water for rinsing off the cleaning solution. In the conventional set-up shown in FIG. 1, the safety containment tank 20 which surrounds the rinse tanks 22, 24 and cleaning tank 12 is substantially isolated from the atmosphere for safety reasons. This presents a problem in that through the outlet 42 of the safety overflow conduit 38, vaporized ammonia frequently escapes to enter the safety containment tank 20. The ammonia vapor 40 fills the chamber interior 26 of the safety containment tank 20.

Since, aqueous solution of ammonia has a relatively low boiling temperature, i.e., at approximately 32° C., aqueous ammonia vaporizes easily at temperatures higher than 32° C. The aqueous solution of ammonia 28 in the supply tank 30 is normally kept at an elevated temperature of 70° C. to facilitate mixing with the other two components of the SC-1 cleaning solution, i.e., the $H_2O_2$ and DI water. The mini-environment 26 that is present in the safety containment tank 20 is normally maintained at a temperature around 55° C. The surrounding temperature where the aqueous solution of ammonia 28 is kept is therefore substantially higher than 32°

C. which causes the aqueous ammonia to vaporize and to escape from outlet 42 of the safety overflow conduit 38 to fill the interior chamber 26 of the safety containment tank 20.

When the chamber interior 26 is filled with ammonia vapor, at the instant that a silicon wafer is being removed from the SC-1 tank 12 into the chamber interior 26, ammonia vapor 40 attaches itself onto the surfaces of the silicon wafer (not shown). When the wafer is again dipped into the post-rinse tank 24 that is filled with DI water, the ammonia vapor attached on the wafer surface reacts with DI water thus forming aqueous solution of ammonia. When the aqueous solution of ammonia is concentrated at localized spots on the wafer surface, a defect of "silicon hole" occurs on the surface of the wafer. The silicon hole is caused by the removal, or the wet etching, of silicon oxide from the wafer surface by the concentrated aqueous ammonia at localized spots. The conventional wet cleaning equipment 10, as shown in FIG. 1, is not provided with cooling devices and thus the ammonia vapor generation cannot be stopped or minimized.

It is therefore an object of the present invention to provide a method for preventing defect formation on a silicon wafer processed in a wet cleaning system that does not have the drawbacks or shortcomings of the conventional methods.

It is another object of the present invention to provide a method for preventing defect formation on a silicon wafer processed in a wet cleaning system which utilizes aqueous solution of ammonia as one of the components in the cleaning mixture.

It is a further object of the present invention to provide a method for preventing defect formation on a silicon wafer processed in a wet cleaning system by providing cooling means to a conduit which connects a chemical supply tank and a cleaning tank.

It is another further object of the present invention to provide a method for preventing defect formation such as silicon holes on a silicon wafer processed in a wet cleaning system by cooling at least one conduit connecting a supply tank and a cleaning tank to a temperature that is sufficiently low such that formation of ammonia vapor in the at least one conduit is prevented.

It is still another object of the present invention to provide a method for preventing defect formation on a silicon wafer processed in a wet cleaning system by cooling a conduit connecting between a supply tank and a cleaning tank with a cooling water having a temperature of less than 20° C.

It is yet another object of the present invention to provide a method for preventing defect formation on a silicon wafer processed in a wet cleaning system by cooling a conduit connecting a supply tank and a cleaning tank such that ammonia vapor is not generated to form aqueous ammonia for attacking the surface of the silicon wafer.

It is still another further object of the present invention to provide a wet cleaning system for an electronic substrate which utilizes a supply tank for holding an aqueous solution of ammonia and a cleaning tank for receiving the aqueous solution of ammonia through a conduit that is sufficiently cooled for preventing ammonia vapor from escaping into the environment that surrounds the cleaning tank.

It is yet another further object of the present invention to provide a wet cleaning system for an electronic substrate which includes a supply tank, a cleaning tank, a conduit connecting the supply tank and the cleaning tank and a cooling means for cooling the conduit by a coolant having a temperature of not higher than 20° C.

SUMMARY OF THE INVENTION

In accordance with the present invention, a method and an apparatus for preventing silicon hole defect formation after a wet cleaning process are provided.

In a preferred embodiment, a method for preventing defect formation on a silicon wafer processed in a wet cleaning system is provided which includes the steps of providing a supply tank for holding an aqueous solution of ammonia, providing a cleaning tank for receiving the aqueous solution of ammonia from the supply tank, connecting the supply tank and the cleaning tank with at least one conduit, and cooling the at least one conduit to a temperature sufficiently low such that formation of ammonia vapor in the at least one conduit is prevented.

In the method for preventing defect formation on a silicon wafer processed in a wet cleaning system, the at least one conduit may further include a pump for transporting the aqueous solution of ammonia from the supply tank, a safety overflow conduit in fluid communication with the supply tank, a conduit for providing fluid communication between the supply tank and the cleaning tank, and a flow control valve in the conduit between the supply tank and the cleaning tank. The system may further include a cleaning tank for cleaning a silicon wafer, and a rinse tank for removing cleaning solution from surfaces of the silicon wafer.

The method for preventing defect formation on a silicon wafer processed in a wet cleaning system may further include the step of filling the cleaning tank with a mixture of the aqueous solution of ammonia, $H_2O_2$ and $H_2O$. The method may further include the step of filling the rinse tank with deionized water. The method may further include the step of preventing the formation of $NH_4OH$ by gaseous $NH_3$ and water vapor in the environment of the rinse tank. The method may further include the step of cooling the at least one conduit with chilled processed water, or cooling the at least one conduit with water that has a temperature of less than 20° C., and preferably has a temperature of between about 15° C. and about 18° C. The method may further include the step of filling the cleaning tank with a mixture of aqueous solution of ammonia, $H_2O_2$ and DI water at a ratio of 1:1:5.

The present invention is further directed to a wet cleaning system for an electronic substrate that includes a supply tank for holding an aqueous solution of ammonia, a cleaning tank for receiving the aqueous solution of ammonia from the supply tank, at least one conduit providing fluid communication between the supply tank and the cleaning tank, and cooling means for cooling the at least one conduit to a temperature sufficiently low such that formation of ammonia vapor in the at least one conduit is substantially prevented.

In the wet cleaning system for an electronic substrate, the system may be a wet-bench utilizing SC-1 cleaning solution. The at least one conduit for the system may include a pump for transporting the aqueous solution of ammonia from the supply tank, a safety overflow conduit in fluid communication with the supply tank, and a flow control valve in the at least one conduit between the supply tank and the cleaning tank. The cleaning tank may further include $H_2O_2$ and DI water. The cleaning tank may include $NH_4OH$, $H_2O_2$ and DI water at a mix ratio of 1:1:5 or 1:5:20. The cleaning tank may further include a rinse tank for removing the cleaning solution from surfaces of the electronic substrate.

In the wet cleaning system for an electronic substrate, the cooling means may further include cooling tubes wrapped around the at least one conduit which provides fluid communication between the supply tank and the cleaning tank, and cooling water that flows in the cooling tubes. The cooling means may further include a cooling water flowing through the cooling means at a temperature between about 15° C. and about 18° C. The cooling means may include a cooling water flowing through the cooling means at a temperature of not higher than 20° C. The supply tank may hold an aqueous solution of ammonia at about 29% concentration.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method and an apparatus for preventing silicon hole defect formation after a wet cleaning process is conducted on a silicon wafer. In the method, a supply tank is first connected to a cleaning tank for feeding to the cleaning tank an aqueous solution of ammonia. The conduit that connects the supply tank and the cleaning tank is provided with cooling means such that it is cooled to a temperature sufficiently low that formation of ammonia vapor in the conduit is prevented. The system may further include the components of a pump for transporting the aqueous solution of ammonia from the supply tank, a safety overflow conduit for the supply tank to prevent overflow, and a flow control valve in the conduit connecting the supply tank and the cleaning tank. The cleaning solution contained in a cleaning tank may be a mixture of SC-1 which contains ammonia hydroxide, $H_2O_2$ and DI water at a mix ratio of 1:1:5. The present invention novel method effectively prevents the formation of aqueous ammonia from gaseous ammonia and water vapor in the mini-environment of the rinse tank.

The present invention further provides a wet cleaning system for cleaning an electronic substrate which includes a supply tank connected to a cleaning tank by a conduit such that an aqueous solution of ammonia may be flown from the supply tank to the cleaning tank. The conduit is further equipped with cooling means such that aqueous solution of ammonia in the conduit does not vaporize into gaseous ammonia to contaminate the mini-environment surrounds the cleaning tank and the rinse tank. The cooling means may be provided by cooling tubes that are wrapped around the conduit which provides fluid communication between the supply tank and the cleaning tank. The cooling means further includes cooling water that flows through the cooling tubes wherein the cooling water is kept at a temperature under 20° C., preferably between about 15° C. and about 18° C.

Figure 1:
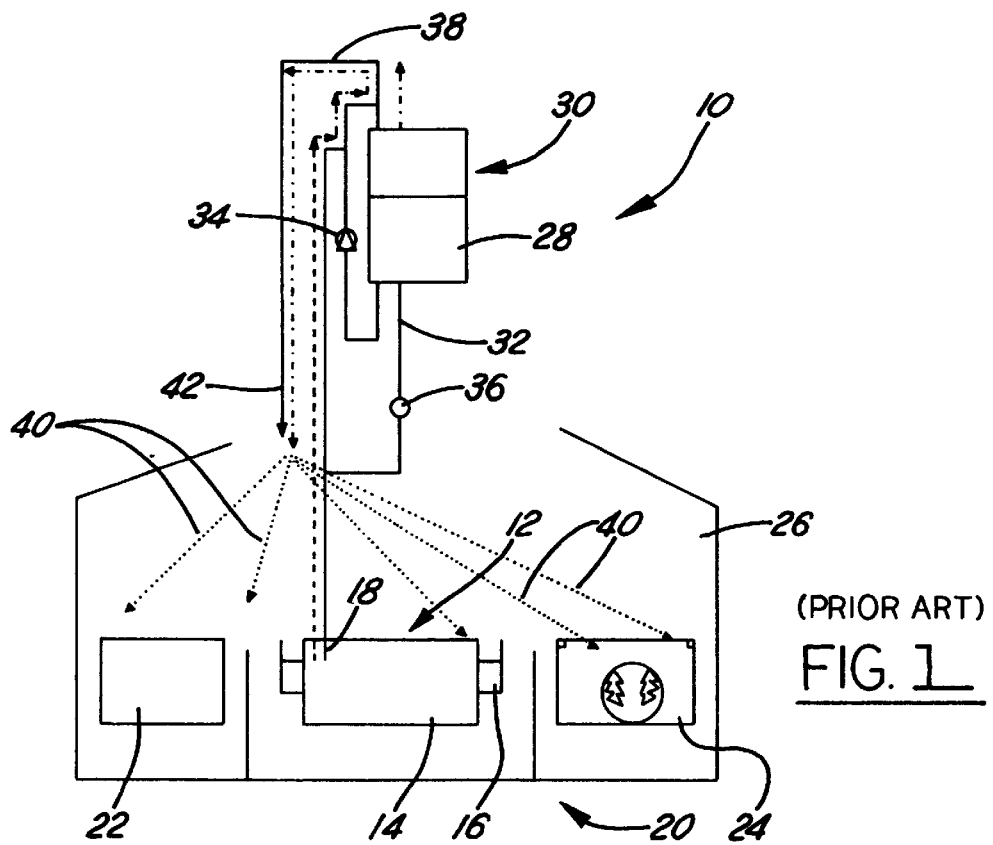
FIG. 1 is a schematic illustrating a conventional wet cleaning system that produces ammonia vapor in the mini-environment that surrounds the cleaning tank.
Figure 2:
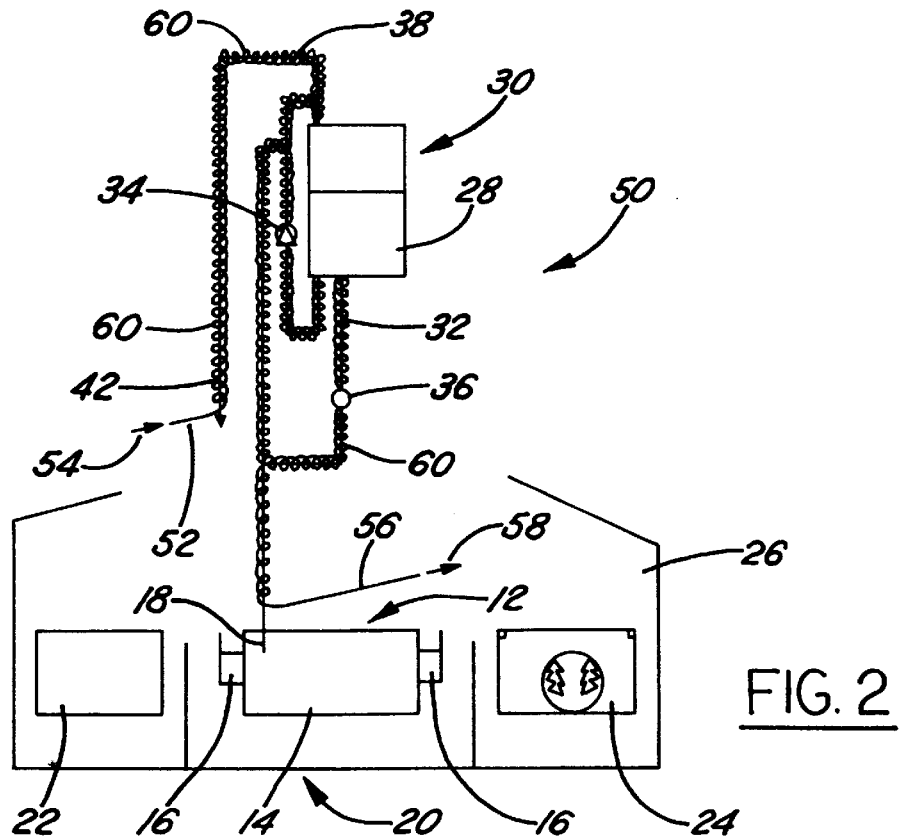
FIG. 2 is a schematic illustrating the present invention wet cleaning system incorporating a cooling means on the conduit which connects the supply tank and the cleaning tank such that ammonia vapor is not produced in the mini-environment that surrounds the cleaning tank.

Referring now to FIG. 2, wherein a schematic of the present invention wet cleaning system 50 is shown. The wet cleaning apparatus 50 is similar to the apparatus shown in FIG. 1, except that all the conduits 32, 38 and 42 are cooled by an ⅛ inch diameter Teflon® tubing 60 which wraps around the conduits 32, 38 and 42. The inlet 52 of the Teflon® tubing 60 is fed a chilled process water 54 kept at a temperature between about 15° C. and about 18° C. Any other chilled water, preferably below the temperature of about 20° C. may also be used as the cooling water for flowing through the Teflon® tubing 60. At the outlet 56 of the Teflon® tubing 60, chilled water 58 of a higher temperature exits the tubing 60 and can be recycled through a chiller.

By utilizing the present invention novel cooling apparatus around the conduits, no ammonia vapor is generated since the conduit temperature is kept at well below 32° C. which is the boiling temperature of aqueous solution of ammonia. The present invention novel method and apparatus therefore is effective in keeping the mini-environment 26 of the safety containment tank 20 substantially without ammonia vapor. The silicon hole defect formed on the wafer surface when the wafer is transported between the cleaning tank 14 and the post-rinse tank 24 is therefore substantially eliminated or minimized. Cooling tubings fabricated of any other material may similarly be used. For instance, a co-axial stainless steel tubing may be used by pumping through a cooling medium in the outside tubing for cooling the cleaning solution flown in the inside tubing. The present invention therefore provides a solution for a long existing problem that could not be solved previously in the semiconductor fabrication industry.

The present invention novel method and apparatus have been amply demonstrated in the above descriptions and in the appended drawing of FIG. 2.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for preventing defect formation on a silicon wafer processed in a wet cleaning system comprising the step of providing a silicon wafer, providing a cleaning tank for receiving said aqueous solution of ammonia from said supply tank, connecting said supply tank said cleaning tank with at least one conduit, and cooling said at least one conduit to a temperature sufficiently low such that formation of ammonia vapor in said at least one conduit is prevented, and cleaning said silicon wafer in said aqueous solution of ammonia.

2. A method for preventing defect formation on a silicon wafer processed in a wet cleaning system according to claim 1, wherein said at least one conduit further comprises:

a pump for transporting said aqueous solution of ammonia from said supply tank, a safety overflow conduit in fluid communication with said supply tank, a conduit for providing fluid communication between said supply tank and said cleaning tank, and a flow control valve in said conduit between said supply tank and said cleaning tank.

3. A method for preventing defect formation on a silicon wafer processed in a wet cleaning system according to claim 1, wherein said cleaning tank further comprises:

a cleaning tank for cleaning a silicon wafer, and a rinse tank for removing cleaning solution from surfaces of said silicon wafer.

4. A method for preventing defect formation on a silicon wafer processed in a wet cleaning system according to claim 1 further comprising the step of filling said cleaning tank with a mixture of said aqueous solution of ammonia, $H_2O_2$ and $H_2O$.

5. A method for preventing defect formation on a silicon wafer processed in a wet cleaning system according to claim 3 further comprising the step of filling said rinse tank with deionized water.

6. A method for preventing defect formation on a silicon wafer processed in a wet cleaning system according to claim 1 further comprising the step of preventing the formation of $NH_4OH$ by gaseous $NH_3$ and water vapor in the environment of said rinse tank.

7. A method for preventing defect formation on a silicon wafer processed in a wet cleaning system according to claim 1 comprising the step of cooling said at least one conduit with chilled process water.

8. A method for preventing defect formation on a silicon wafer processed in a wet cleaning system according to claim 1 further comprising the step of cooling said at least one conduit with water at a temperature of not higher than 20° C.

9. A method for preventing defect formation on a silicon wafer processed in a wet cleaning system according to claim 1 further comprising the step of cooling said at least one conduit with water at a temperature of between about 15° C. and about 18° C.

10. A method for preventing defect formation on a silicon wafer processed in a wet cleaning system according to claim 1 further comprising the step of filling said cleaning tank with a mixture of said aqueous solution of ammonia, $H_2O_2$ and DI water at a ratio of 1:1:5.

11. A wet cleaning system for an electronic substrate comprising:

a supply tank for holding an aqueous solution of ammonia, a cleaning tank for receiving said aqueous solution of ammonia from said supply tank, at least one conduit providing fluid communication between said supply tank and said cleaning tank, and cooling means for cooling said at least one conduit to a temperature sufficiently low such that formation of ammonia vapor in said at least one conduit is substantially prevented.

12. A wet cleaning system for an electronic substrate according to claim 11, wherein said system is a wet-bench system utilizing SC-1 cleaning solution.

13. A wet cleaning system for an electronic substrate according to claim 11, wherein said at least one conduit further comprises:

a pump for transporting said aqueous solution of ammonia from said supply tank, a safety overflow conduit in fluid communication with said supply tank, and a flow control valve in said at least one conduit between said supply tank and said cleaning tank.

14. A wet cleaning system for an electronic substrate according to claim 11, wherein said cleaning tank further comprises $H_2O_2$ and DI water.

15. A wet cleaning system for an electronic substrate according to claim 11, wherein said cleaning tank comprises $NH_4OH$, $H_2O_2$ and DI water at a mix ratio of 1:1:5.

16. A wet cleaning system for an electronic substrate according to claim 11, wherein said cleaning tank further comprises a rinse tank for removing said cleaning solution from surfaces of said electronic substrate.

17. A wet cleaning system for an electronic substrate according to claim 11, wherein said cooling means comprises cooling tubes wrapped around said at least one conduit providing fluid communication between said supply tank and said cleaning tank, and cooling water flowing in said cooling tubes.

18. A wet cleaning system for an electronic substrate according to claim 11, wherein said cooling means comprises a cooling water flowing through said cooling means at a temperature between about 15° C. and about 18° C.

19. A wet cleaning system for an electronic substrate according to claim 11, wherein said cooling means comprises a cooling water flowing through said cooling means at a temperature of not higher than 20° C.

20. A wet cleaning system for an electronic substrate according to claim 11, wherein said supply tank holds an aqueous solution of ammonia at about 29% concentration.

* * * * *